United States Patent
Yoneda

(10) Patent No.: US 9,775,265 B2
(45) Date of Patent: Sep. 26, 2017

(54) HEATSINK AND CIRCUIT BOARD WITH HEATSINK

(71) Applicant: KYOCERA Document Solutions Inc., Osaka (JP)

(72) Inventor: Shogo Yoneda, Osaka (JP)

(73) Assignee: KYOCERA Document Solutions Inc., Tamatsukuri, Chuo-ku, Osaka (JP)

( * ) Notice: Subject to any disclaimer, the term of this patent is extended or adjusted under 35 U.S.C. 154(b) by 0 days.

(21) Appl. No.: 15/195,510

(22) Filed: Jun. 28, 2016

(65) Prior Publication Data

US 2017/0006697 A1 Jan. 5, 2017

(30) Foreign Application Priority Data

Jun. 30, 2015 (JP) .................................. 2015-131398

(51) Int. Cl.
*H05K 7/20* (2006.01)
*H05K 9/00* (2006.01)
*H05K 1/02* (2006.01)

(52) U.S. Cl.
CPC ....... *H05K 7/20154* (2013.01); *H05K 1/0209* (2013.01); *H05K 1/0216* (2013.01); *H05K 7/20145* (2013.01); *H05K 9/0022* (2013.01); *H05K 2201/066* (2013.01); *H05K 2201/10371* (2013.01)

(58) Field of Classification Search
CPC ......... H05K 7/20145–7/20163; H05K 1/0209; H05K 9/0022; H05K 2201/10371; H05K 2201/066; H05K 7/20154
USPC ....................................... 361/679.49, 679.51
See application file for complete search history.

(56) References Cited

U.S. PATENT DOCUMENTS

| | | | | |
|---|---|---|---|---|
| 5,583,316 A * | 12/1996 | Kitahara | ............... | H01L 23/427 174/16.3 |
| 6,678,157 B1 * | 1/2004 | Bestwick | .................. | G06F 1/20 165/104.34 |
| 7,286,361 B2 * | 10/2007 | Yamanaka | ............ | H01L 23/367 165/185 |
| 7,551,437 B2 | 6/2009 | Itoh | | |

(Continued)

FOREIGN PATENT DOCUMENTS

JP  H10-070383 A  3/1998
JP  2007-059731 A  3/2007

*Primary Examiner* — David M Sinclair
*Assistant Examiner* — Robert Brown
(74) *Attorney, Agent, or Firm* — IP Business Solutions, LLC

(57) ABSTRACT

A heatsink to be mounted on a circuit board including a plurality of electronic parts is constituted of a conductive and rectangular plate-shaped member, and mounted on the circuit board such that a main surface of the heatsink blocks an airflow generated on the circuit board, the heatsink being electrically grounded. The main surface includes a contacting portion disposed in contact with the circuit board and an isolated portion separated from the circuit board, the isolated portion being cut into two parts along a straight line extending in a direction away from the circuit board. The two parts are each bent such that an end portion on a side of the straight line is oriented to a downstream side of the airflow, so that an opening is defined between the respective end portions of the two parts on the side of the straight line.

12 Claims, 8 Drawing Sheets

(56) References Cited

U.S. PATENT DOCUMENTS

2007/0047202 A1* 3/2007 Itoh ................... H05K 7/20172
 361/695
2007/0206357 A1* 9/2007 Hellinger ............ H01L 23/3672
 361/709
2015/0043167 A1* 2/2015 Guenin ............... H01L 23/3672
 361/719
2015/0153113 A1* 6/2015 Glover ................. H01L 23/467
 361/692

* cited by examiner

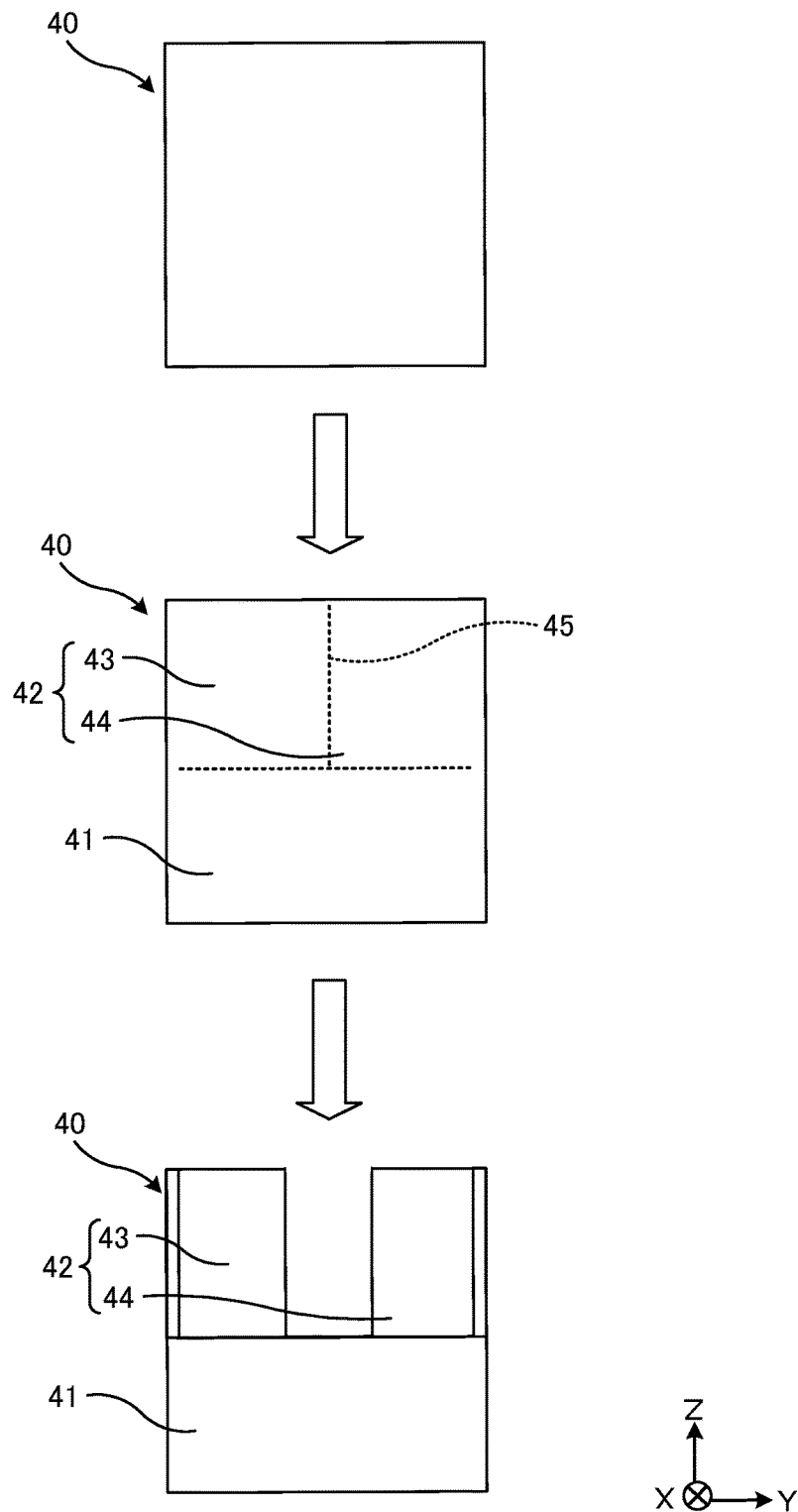

HEATSINK AND CIRCUIT BOARD WITH HEATSINK

INCORPORATION BY REFERENCE

This application claims priority to Japanese Patent Application No. 2015-131398 filed on Jun. 30, 2015, the entire disclosure of which are incorporated herein by reference.

BACKGROUND

The present disclosure relates to a heatsink provided on a circuit board including a plurality of electronic parts, and the circuit board with the heatsink.

In electronic apparatuses such as a copier, various electronic parts are mounted on a circuit board. The electronic parts generate heat while the electronic apparatus is in operation. The electronic parts may malfunction or be deteriorated when exposed to high temperature, and therefore some countermeasures have to be taken against heat. The countermeasures against heat thus far developed include, for example, employing a cooling fan forced air cooling, and attaching a heatsink formed of a highly heat-conductive material to the electronic parts.

When the electronic apparatus is in operation, the electronic parts also radiate electromagnetic noise. Accordingly, additional countermeasures have to be taken against electromagnetic noise because the electromagnetic noise is prone to provoke malfunction of the electronic parts. For example, the heatsink is provided so as to cover the electronic parts and the periphery thereof, to block the electromagnetic noise radiated from the electronic parts and also cool the electronic parts.

SUMMARY

The disclosure proposes further improvement of the foregoing technique. In an aspect, the disclosure provides a heatsink to be mounted on a circuit board including a plurality of electronic parts. The heatsink is constituted of a conductive and rectangular plate-shaped member, and mounted on the circuit board such that a main surface of the heatsink blocks an airflow generated on the circuit board, the heatsink being electrically grounded. The main surface includes a contacting portion disposed in contact with the circuit board and an isolated portion separated from the circuit board, the isolated portion being cut into two parts along a straight line extending in a direction away from the circuit board. The two parts are each bent such that an end portion on a side of the straight line is oriented to a downstream side of the airflow, so that an opening is defined between the respective end portions of the two parts on the side of the straight line.

In another aspect, the disclosure provides a circuit board including a plurality of electronic parts mounted thereon and the foregoing heatsink. At least a part of the plurality of electronic parts is located in a region where the airflow is formed. The heatsink is located upstream of the electronic parts located in the region where the airflow is formed.

BRIEF DESCRIPTION OF THE DRAWINGS

FIG. 3 is a schematic drawing for explaining a manufacturing process of the heatsink according to the embodiment of the disclosure;

DETAILED DESCRIPTION

Hereafter, a heatsink according to an embodiment of the disclosure will be described with reference to the drawings.

Figure 1:
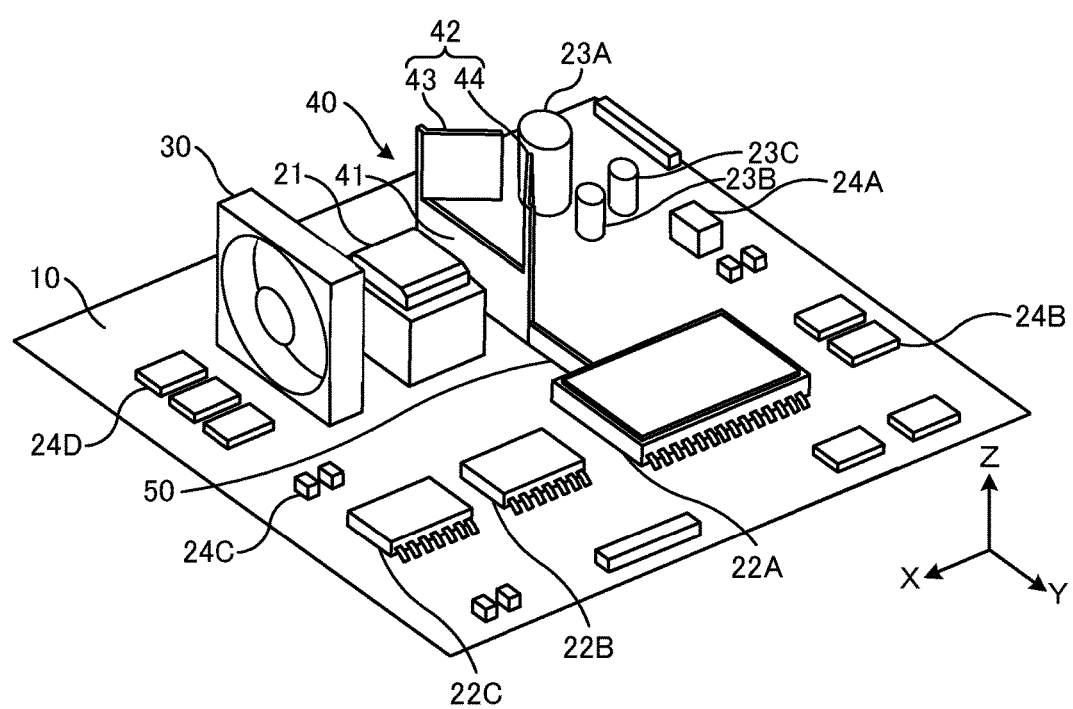
FIG. 1 is a perspective view showing a circuit board on which a heatsink according to an embodiment of the disclosure is mounted.
Figure 2:
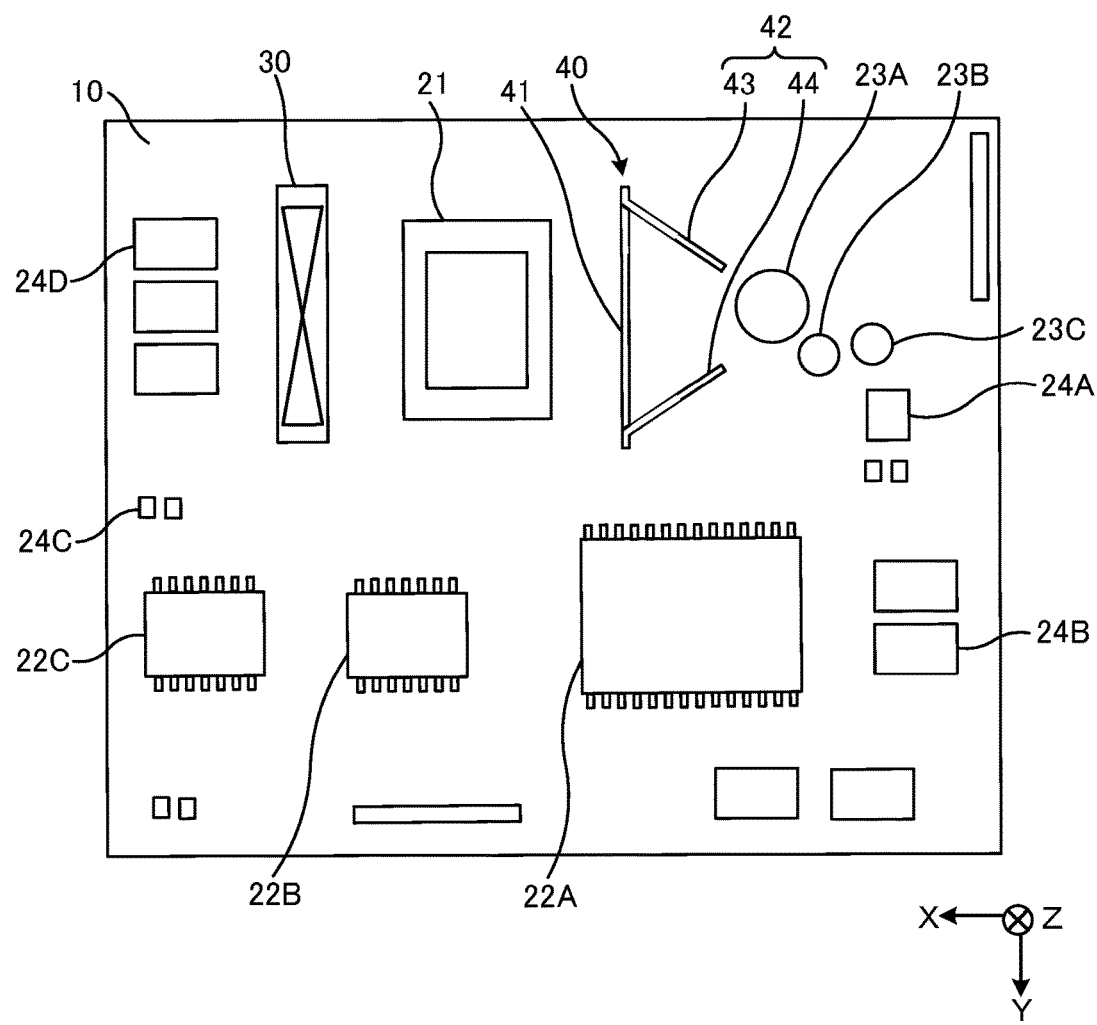
FIG. 2 is a plan view of the circuit board on which the heatsink according to the embodiment of the disclosure is mounted.

FIG. 1 is a perspective view showing a circuit board on which a heatsink according to an embodiment of the disclosure is mounted. FIG. 2 is a plan view of the circuit board on which the heatsink according to the embodiment of the disclosure is mounted.

A circuit board 10 is formed of an insulative or low-conductive material such as glass epoxy material, a resin material, or a ceramic material, and includes various electronic parts mounted on the upper face, to realize the function of the electronic apparatus, for example a copier. The circuit board 10 also includes a wiring pattern for connecting the electronic parts mounted on the circuit board 10.

In the example shown in FIG. 1 and FIG. 2, a transformer 21, integrated circuits (hereinafter, IC) 22A, 22B, and 22C, capacitors 23A, 23B, and 23C, and other electronic parts 24A, 24B, 24C, and 24D are mounted on the upper face of the circuit board 10. The transformer 21 converts an AC voltage supplied from a non-illustrated power source into a DC voltage. Each of the ICs 22A, 22B, and 22C is a system-on-chip (SoC) in which electronic elements such as transistors are integrated into a chip, and includes a plurality of input terminals and output terminals. The capacitors 23A, 23B, and 23C are, for example, an electrolytic capacitor and a ceramic capacitor. It is to be noted that some of the electronic parts mounted on the upper face of the circuit board 10 are not given a reference numeral, for the sake of visual clarity of the drawings.

These electronic parts generate heat when the electronic apparatus such as a copier is in operation. Since the electronic parts are prone to malfunction or be deteriorated when exposed to high temperature, a cooling fan 30 is provided on the circuit board 10 to cool the electronic parts. The cooling fan 30 includes a plurality of vanes (not shown) and a motor for rotating the vanes. In the example shown in FIG. 1 and FIG. 2, the cooling fan 30 generates airflow proceeding in a −X direction on the circuit board 10.

The airflow forcibly air-cools the electronic parts mounted on the upper face of the circuit board 10. In particular, the electronic parts in a region where the airflow is formed are efficiently cooled. The transformer 21 has a relatively high calorific value among the electronic parts mounted on the upper face of the circuit board 10, and is therefore located close to the cooling fan 30, in the region where the airflow is formed by the cooling fan 30.

Now, a heatsink 40 is provided downstream of the transformer 21, in the direction of the airflow generated by the cooling fan 30. The heatsink 40 is located such that the main surface is erected perpendicular to the upper face of the circuit board 10. Accordingly, a part of the airflow generated by the cooling fan 30 is blocked by the main surface of the heatsink 40.

The heatsink 40 is constituted of a single sheet of rectangular plate-shaped member made of a material having high thermal conductivity and electrical conductivity such as aluminum or copper, and thermally connected to the IC 22A via a heat path 50, for example a heat pipe. Heat generated in the IC 22A is transmitted to the heatsink 40 through the heat path 50, and forcibly air-cooled in the heatsink 40.

The main surface of the heatsink 40 is divided into a contacting portion 41 located in contact with the circuit board 10, and an isolated portion 42 located in an upper position of the contacting portion 41 and separated from the circuit board 10. Further, the isolated portion 42 is cut into two parts, namely a left part 43 and a right part 44, along a straight line extending away from the circuit board. The left part 43 and the right part 44 are each bent to a downstream side in the airflow direction about an end portion opposite to the other end portion along which the isolated portion 42 is cut, so as to define an opening in a central region of the isolated portion 42. In contrast, the contacting portion 41 of the heatsink 40 is not bent. In other words, the contacting portion 41 is in contact with a linear region on the circuit board 10.

An angle by which the left part 43 and the right part 44 are bent is determined such that a width of the opening formed in the central region of the isolated portion 42 (length along a direction parallel to the circuit board 10) becomes shorter than the width of the isolated portion 42. In other words, the angle by which the left part 43 and the right part 44 are bent is set to an angle narrower than approximately 90 degrees.

In addition, the heatsink 40 is electrically grounded. The heatsink 40 serves, because of being formed of a material having high thermal conductivity and electrical conductivity such as aluminum or copper, as a shield against electromagnetic noise radiated from the electronic parts including the transformer 21, to block the electromagnetic noise radiated from the electronic parts including the transformer 21.

FIG. 3 is a schematic drawing for explaining a manufacturing process of the heatsink according to the embodiment of the disclosure. As illustrated in FIG. 3, the heatsink 40 may be manufactured through preparing a plate-shaped member (uppermost stage in FIG. 3), determining a position of the straight line 45 along which the plate-shaped member is to be cut (cutting position) and cutting the plate-shaped member (intermediate stage in FIG. 3), and bending the left part 43 and the right part 44. Thus, the heatsink 40 has a simple structure which can be easily made up. The cutting position and the bending angle of the left part 43 and the right part 44 are determined depending on the position of the electronic parts located downstream of the heatsink 40 in the airflow direction, further details of which will be subsequently described. Adjusting thus the cutting position and the bending angle of the left part 43 and the right part 44 with respect to the plate-shaped member allows the heatsink 40 to be manufactured in an optimal shape for the arrangement of the electronic parts on the circuit board 10, such as the types, the number, and the positions of the electronic parts. In general, an exclusive heatsink has to be designed in consideration of the arrangement of the electronic parts, which is a troublesome task. In contrast, the heatsink according to this embodiment of the disclosure can be formed into a shape appropriate for the arrangement of the electronic parts, simply by adjusting the cutting position and the bending angle with respect to a single sheet of plate-shaped member.

The heatsink according to the embodiment of the disclosure is configured as above. Hereunder, advantageous effects of the heatsink will be described.

Figure 4A:
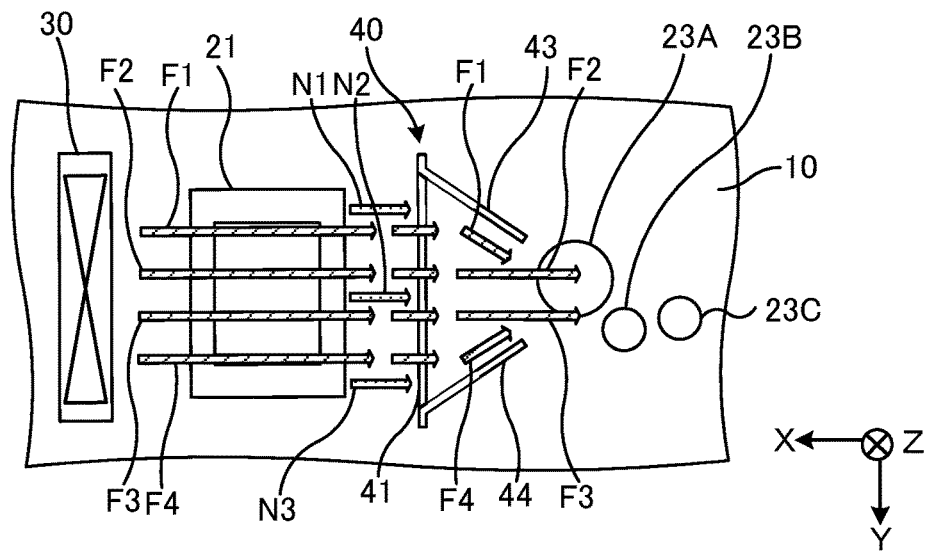
FIG. 4A and FIG. 4B are plan views for explaining flows of air and electromagnetic noise on a circuit board on which the heatsink according to the embodiment of the disclosure is mounted.
Figure 4B:
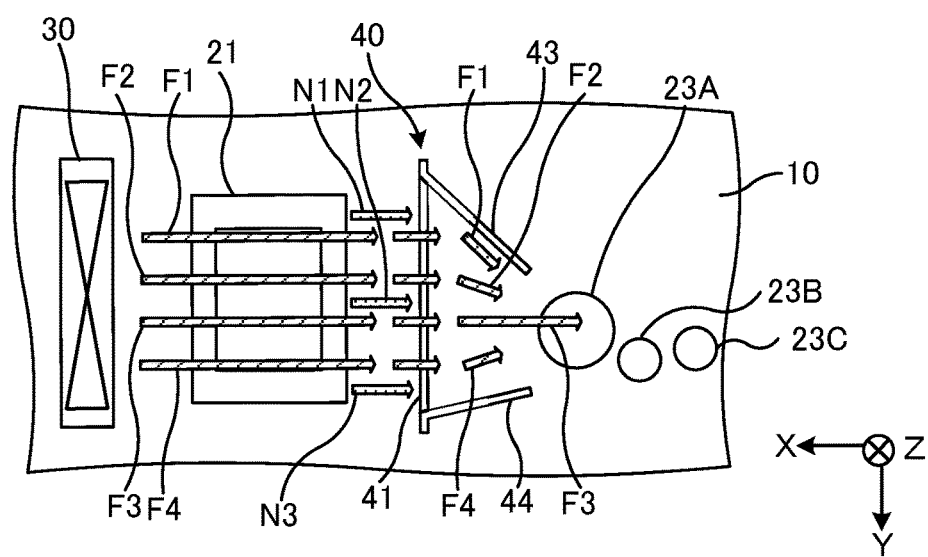

FIG. 4A and FIG. 4B are plan views for explaining flows of air and electromagnetic noise on a circuit board on which the heatsink according to the embodiment of the disclosure is mounted.

First, the flow of air will be described. As shown in FIG. 4A, airflows F1 to F4 generated by the cooling fan 30 pass above the transformer 21 and reach the heatsink 40. A lower portion of the airflows F1 to F4 which have reached the heatsink 40 is blocked by the contacting portion 41 of the heatsink 40. An upper portion of the airflows F1 to F4 passes through the opening formed in the isolated portion 42. In this process, the airflows F1 and F4 are caused to change the flow direction by the left part 43 and the right part 44 respectively, toward the opening formed in the isolated portion 42. Accordingly, the airflow from the cooling fan 30 is concentrated in a region downstream of the opening formed in the isolated portion 42. In the region downstream of the opening formed in the isolated portion 42, the electronic parts such as the capacitors 23A, 23B, and 23C are located. Therefore, such electronic parts can be forcibly cooled by the airflow from the cooling fan 30.

Here, instead of forming the opening for air to pass through by bending a plate-shaped member as the heatsink according to the embodiment of the disclosure, a part of the plate-shaped member may be cut away so as to form an opening for air to pass through. However, in the case of forming a cutaway portion in the plate-shaped member, the area of the plate-shaped member contacted by the airflow from the cooling fan 30 is reduced by an amount corresponding to the cutaway portion, which leads to degraded cooling performance. In contrast, in the heatsink according to the embodiment of the disclosure, the plate-shaped member is bent so as to form the opening for air to pass through, and therefore the area contacted by the airflow from the cooling fan 30 remains unchanged. In other words, the electronic parts located downstream of the heatsink 40 in the airflow direction can be forcibly cooled, without incurring significant degradation in cooling performance compared with the plate-shaped member that has not been bent.

The flow of the electromagnetic noise will now be described. As shown in FIG. 4A, electromagnetic noises N1, N2 are radiated from the transformer 21, when the electronic apparatus such as a copier is in operation. Since the contacting portion 41 of the heatsink 40 is not bent unlike the isolated portion 42 and hence does not include an opening, the electromagnetic noises N1, N2 radiated from the transformer 21 is blocked by the contacting portion 41 of the heatsink 40. Therefore, the propagation of the electromagnetic noises N1, N2 can be effectively suppressed from propagating to the electronic parts such as the capacitors 23A, 23B, and 23C located downstream of the heatsink 40 in the airflow direction.

Here, the isolated portion 42 and the contacting portion 41 of the heatsink 40 may both be formed in an L-shape. In this case, however, although the airflow from the cooling fan 30 can be made to reach the electronic parts located downstream of the heatsink 40 in the airflow direction so as to forcibly cool the electronic parts, a part of the electromagnetic noise radiated from the transformer 21 leaks from the contacting portion 41, and therefore the electromagnetic noise is unable to be effectively blocked. In addition, with the known technique of covering the electronic parts and the periphery thereof with the heatsink to thereby block the electromagnetic noise radiated from the transformer 21 and cool the electronic parts, a portion to cover the electronic parts and another portion to receive the airflow from the cooling fan have to be formed in the heatsink, which leads to a complicated structure of the heatsink. In contrast, the heatsink according to the embodiment of the disclosure enables the electromagnetic noise to be effectively blocked, in addition to cooling the electronic parts, with a simple structure.

FIG. 4B illustrates the flows of air and electromagnetic noise caused by a heatsink different from the one shown in FIG. 4A. In FIG. 4B, the positions of the capacitors 23A, 23B, and 23C are shifted in a Y-direction compared with the FIG. 4A. The cutting position of the isolated portion 42 is changed so as to address the airflow from the cooling fan 30 toward the capacitors 23A, 23B, and 23C located as shown in FIG. 4B. In addition, the bending angles of the left part 43 and the right part 44 are changed. More specifically, the cutting position of the isolated portion 42 is shifted toward the right part 44 compared with the example of FIG. 4A. The left part 43 is bent by a narrower angle and the right part 43 is bent by a wider angle, compared with the example of FIG. 4A. Such a configuration allows the position of the opening formed in the isolated portion 42 to be changed, and the airflow from the cooling fan 30 to be concentrated in the region where the capacitors 23A, 23B, and 23C are located.

Supplement 1

The heatsink 40 may be located close to an electronic part (in the embodiment, transformer 21) that radiates noise that exceeds a predetermined value when the electronic apparatus such as a copier is in operation, among the plurality of electronic parts mounted on the upper face of the circuit board 10. Such a configuration enables the electromagnetic noise generated in the circuit board 10 as a whole to be effectively suppressed.

Supplement 2

Figure 5A:
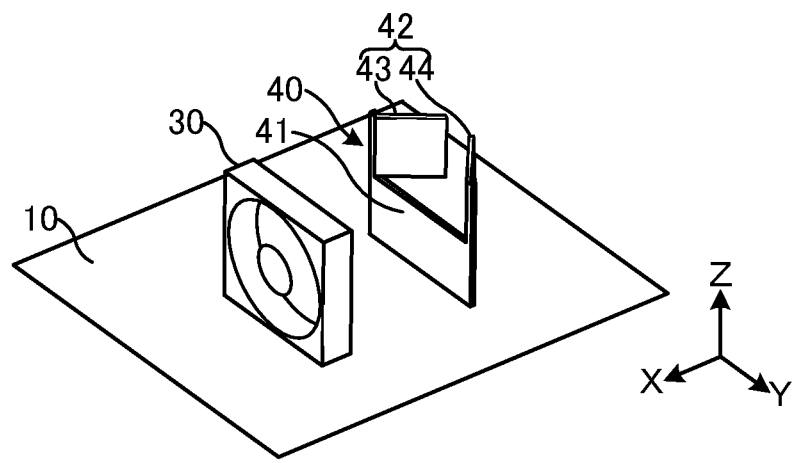
FIG. 5A is a schematic perspective view showing the heatsink and a cooling fan according to the embodiment of the disclosure.

As described above, in the heatsink according to the embodiment of the disclosure, the left part 43 and the right part 44 formed by cutting the isolated portion 42 along the straight line extending away from the circuit board 10 are bent to the downstream side in the airflow direction, so as to form the opening in the central region of the isolated portion 42. In this case, the positional relationship between the cooling fan 30 and the heatsink 40 is as illustrated in FIG. 5A.

Figure 5B:
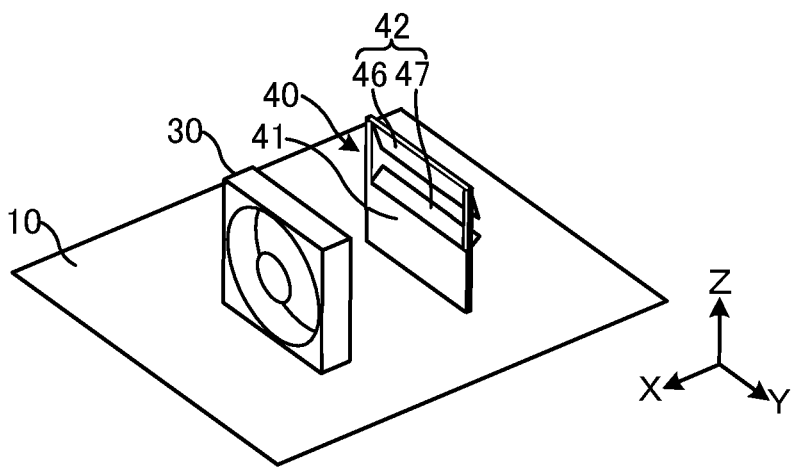
FIG. 5B, FIG. 5C, and FIG. 5D are schematic perspective views each showing a heatsink and a cooling fan according to a comparative example.

Now, it will be assumed that, as shown in FIG. 5B, an upper part 46 and a lower part 47 formed by cutting the isolated portion 42 along a straight line parallel to the upper face of the circuit board 10 are bent to the downstream side in the airflow direction. With such a configuration also, the electromagnetic noise can be blocked and the electronic parts located downstream in the airflow direction can be cooled. However, the air that has passed through the opening of the isolated portion 42 is impeded by the lower part 47 from flowing toward the circuit board 10. Therefore, the heatsink according to the embodiment of the disclosure is superior to the heatsink shown in FIG. 5B in cooling performance with respect to the electronic parts located downstream in the airflow direction.

Supplement 3

As described above, in the heatsink according to the embodiment of the disclosure, the bending angles of the left part 43 and the right part 44 of the isolated portion 42 are set to an angle narrower than approximately 90 degrees, so as to make the width of the opening formed in the isolated portion 42 narrower than the width of the isolated portion 42. Hereunder, configurations shown in FIG. 5C and FIG. 5D will be reviewed, in which the left part 43 and the right part 44 are bent by approximately 90 degrees and by an angle wider than 90 degrees, respectively.

Figure 5C:
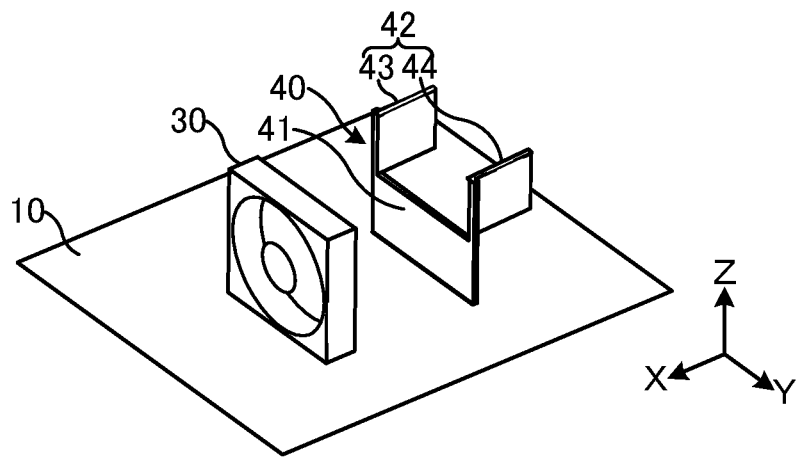

When the left part 43 and the right part 44 are bent by approximately 90 degrees as shown in FIG. 5C, the airflow from the cooling fan 30 is not changed by the left part 43 and the right part 44. Accordingly, the airflow from the cooling fan 30 is unable to be concentrated in the region where the electronic parts to be forcibly cooled, such as the capacitors 23A, 23B, and 23C, are located. Therefore, the heatsink according to the embodiment of the disclosure is superior to the heatsink shown in FIG. 5C in cooling performance with respect to the electronic parts.

Figure 5D:
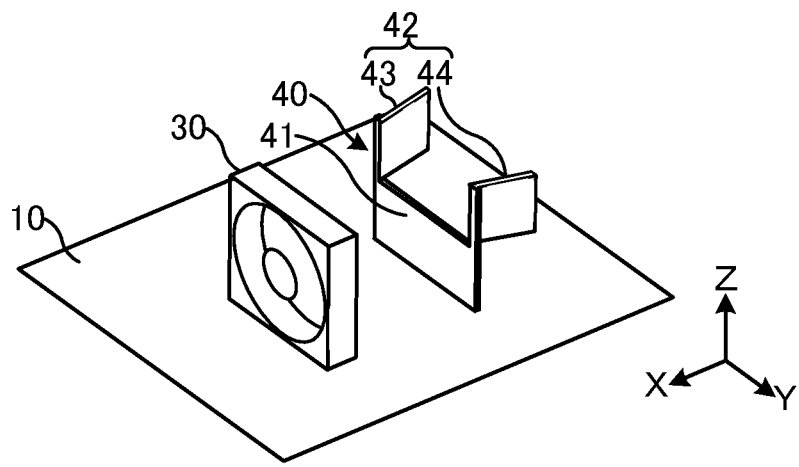

When the left part 43 and the right part 44 are bent by an angle wider than approximately 90 degrees as shown in FIG. 5D, the airflow from the cooling fan 30 is unable to be concentrated in the region where the electronic parts to be forcibly cooled, such as the capacitors 23A, 23B, and 23C, are located, like the case shown in FIG. 5C. In addition, the air that has passed through the opening of the isolated portion 42 does not flow along the left part 43 and the right part 44 but flows through a region distant from the left part 43 and the right part 44. Accordingly, heat exchange between the air that has passed through the opening of the isolated portion 42, and the left part 43 and the right part 44, is not effectively performed. Therefore, the heatsink according to the embodiment of the disclosure is superior to the heatsink shown in FIG. 5D in cooling performance with respect to the electronic parts.

Although the left part 43 and the right part 44 of the isolated portion 42 are bent by an angle narrower than approximately 90 degrees so that the end portions of both of the left part 43 and the right part 44 on the side of the cutting position are located inside the width of the isolated portion 42, the disclosure is not limited to such a configuration. It suffices that at least one of the left part 43 and the right part 44 of the isolated portion 42 is bent by an angle narrower than approximately 90 degrees so that the end portion of the left part 43 or the right part 44 on the side of the cutting position is located inside the width of the isolated portion 42, because in this case also the airflow from the cooling fan 30 can be concentrated in the region where the electronic parts to be forcibly cooled, such as the capacitors 23A, 23B, and 23C, are located.

Supplement 4

In the foregoing embodiment, the transformer 21 having a prominently high calorific value among the electronic parts mounted on the upper face of the circuit board 10, is located between the cooling fan 30 which is the source of the airflow and the heatsink 40 which blocks a part of the airflow generated by the cooling fan 30. Locating thus the electronic parts having a calorific value equal to or higher than a predetermined value in the region between the cooling fan 30 and the heatsink 40, where the airflow from the cooling fan 30 is not impeded at all, instead of in the region downstream of the heatsink 40 in the airflow direction like the electronic parts having a calorific value lower than the predetermined value, such as the capacitors 23A, 23B, improves the cooling efficiency.

Variation

The disclosure may be modified in various manners without limitation to the foregoing embodiment. The configurations and arrangements illustrated in FIG. 1 to FIG. 5 merely represent some exemplary embodiments of the disclosure, and are not intended to limit the configurations and arrangements of the disclosure.

Figure 6A:
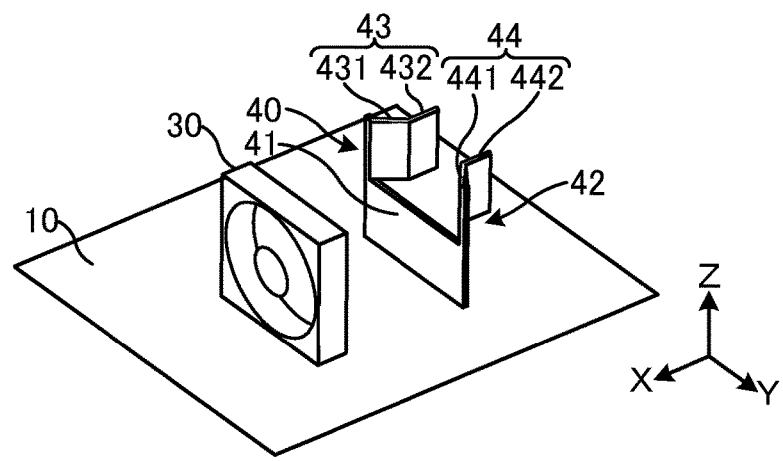
FIG. 6A is a schematic perspective view showing a heatsink and a cooling fan according to a variation of the disclosure.
Figure 6B:
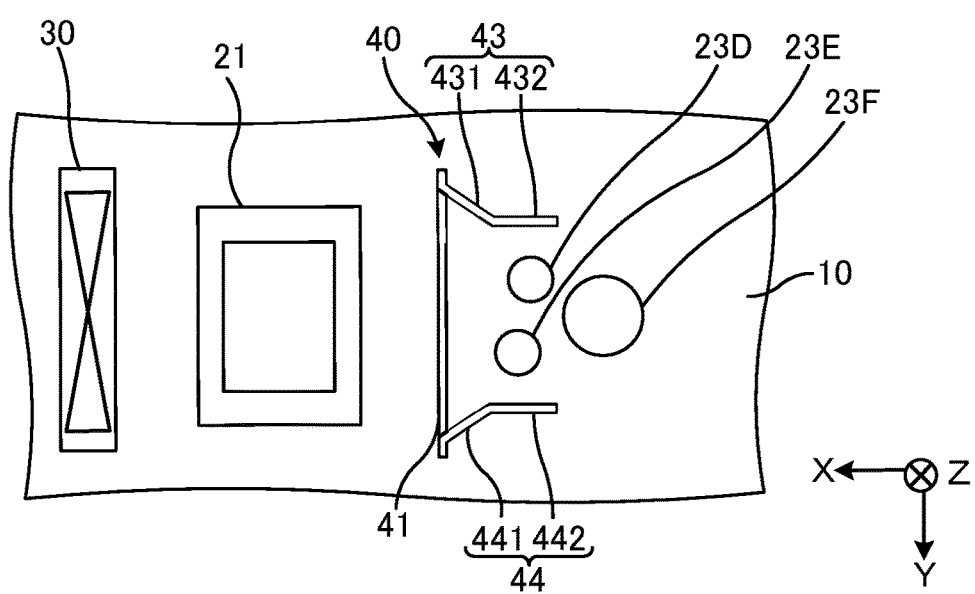
FIG. 6B is a schematic plan view of a circuit board on which the heatsink according to the variation is mounted.

FIG. 6A is a schematic perspective view showing a heatsink and a cooling fan according to a variation of the disclosure. FIG. 6B is a schematic plan view of a circuit board on which the heatsink according to the variation is mounted. In the foregoing embodiment, the left part 43 and the right part 44 are each bent to the downstream side in the airflow direction about the end portion opposite to the other end portion on the side of the cutting position. In this variation, in contrast, the left part 43 and the right part 44 are each further bent to the downstream side in the airflow direction about a straight line located between the end portion on the side of the cutting position and the opposite end portion, in addition to being bent about the opposite end portion. Accordingly, a base portion 431 of the left part 43 is inclined by a certain angle with respect to the airflow, and a distal end portion 432 of the left part 43 is parallel to the airflow. Likewise, a base portion 441 of the right part 44 is inclined by a certain angle with respect to the airflow, and a distal end portion 442 of the right part 44 is parallel to the airflow.

In this variation, in addition, the capacitors 23D and 23E out of the capacitors 23D, 23E, and 23F located downstream in the airflow direction are located between the distal end portion 432 of the left part 43 and the distal end portion 442 of the right part 44.

Further bending thus the left part 43 and the right part 44 allows a larger region to be secured between the left part 43 and the right part 44, compared with the configuration according to the foregoing embodiment. Therefore, the circuit parts to be cooled, such as the capacitors, can be located in the region between the left part 43 and the right part 44. Locating thus the circuit parts to be cooled between the left part 43 and the right part 44 improves the heat exchange efficiency between the circuit parts to be cooled, and the left part 43 and the right part 44.

Figure 7:
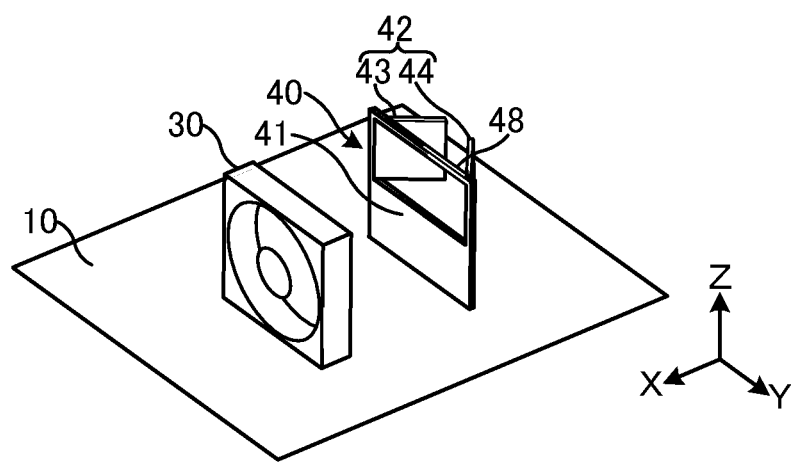
FIG. 7 is a schematic perspective view showing a heatsink and a cooling fan according to another variation of the disclosure.

FIG. 7 is a schematic perspective view showing a heatsink and a cooling fan according to another variation of the disclosure. In the foregoing embodiment, the straight line 45 along which the plate-shaped member is cut is drawn from the lower end of the isolated portion 42 all the way to the upper end thereof, so that isolated portion 42 is cut into the left part 43 and the right part 44 over its entire height. In this variation, in contrast, the straight line 45 along which the plate-shaped member is cut is not formed in the upper end portion 48 of the isolated portion 42, so that the portion of the isolated portion 42 except for the upper end portion 48 is cut into the left part 43 and the right part 44, and the upper end portion 48 of the isolated portion 42 remains integral without being cut. Such a configuration allows sufficient strength of the left part 43 and the right part 44 can be secured.

In the foregoing embodiment, for example, the electronic parts are located downstream of the heatsink 40 in the airflow direction, however the disclosure is not limited to such a configuration. A heatsink similar to the heatsink 40 may be provided downstream of the heatsink 40 in the airflow direction.

Further, although the left part 43 and the right part 44 are each bent to the downstream side in the airflow direction about the end portion opposite to the other end portion on the side of the cutting position in the foregoing embodiment, the disclosure is not limited to such a configuration. The left part 43 and the right part 44 may be bent about another position than the end portion opposite to the other end portion on the side of the cutting position.

Various modifications and alterations of this disclosure will be apparent to those skilled in the art without departing from the scope and spirit of this disclosure, and it should be understood that this disclosure is not limited to the illustrative embodiments set forth herein.

What is claimed is:

1. A heatsink for use in a circuit board including a plurality of electronic parts, the heatsink being constituted of a conductive and rectangular plate-shaped member, and mounted on the circuit board such that a main surface of the heatsink blocks an airflow generated on the circuit board, the heatsink being electrically grounded,
wherein the main surface includes a contacting portion disposed in contact with the circuit board and an isolated portion separated from the circuit board, the isolated portion being cut into two parts along a straight line extending in a direction away from the circuit board, and
the two parts are each bent such that an end portion on a side of the straight line is oriented to a downstream side of the airflow, so that an opening is defined between the respective end portions of the two parts on the side of the straight line.

2. The heatsink according to claim 1,
wherein the two parts are each bent about an end portion opposite to the end portion on the side of the straight line, so that the opening is defined in a central region of the isolated portion.

3. The heatsink according to claim 2,
wherein the two parts are each further bent to the downstream side of the airflow about a straight line located between the end portion on the side of the straight line and the opposite end portion, in addition to being bent about the opposite end portion, and a part further bent is oriented parallel to the airflow.

4. The heatsink according to claim 3,
wherein at least a part of the plurality of electronic parts is located in a region between the two bent parts.

5. The heatsink according to claim 1,
wherein an end portion of the isolated portion on an opposite side of the circuit board remains integral without being cut into two parts.

6. The heatsink according to claim 1,
wherein a position of the straight line along which the isolated portion is to be cut and an angle by which the two parts are to be bent are determined depending on positions of the electronic parts located downstream of the heatsink in a direction of the airflow.

7. The heatsink according to claim 1,
wherein orientation of the end portion of each of the two parts on the side of the straight line is determined so that a length of the opening along a direction parallel to the circuit board becomes shorter than a length of the isolated portion along the same direction.

8. The heatsink according to claim 1, being located at a position close to an electronic part that radiates noise of a level equal to or higher than a predetermined threshold, among the electronic parts.

9. The heatsink according to claim 1,
wherein the contacting portion remains unchanged and is in contact with a linear region on the circuit board.

10. A circuit board comprising:
a plurality of electronic parts provided on the circuit board; and
the heatsink according to claim 1.

11. The circuit board according to claim 10,
wherein at least a part of the plurality of electronic parts is located in a region where the airflow is formed, and
the heatsink is located upstream of the electronic part located in the region where the airflow is formed.

12. The circuit board according to claim 10, further comprising a fan provided on the circuit board to generate the airflow,
wherein an electronic part having a calorific value equal to or higher than a predetermined threshold among the electronic parts is located between the fan and the heatsink.

* * * * *